United States Patent [19]

Harari

[11] 4,395,723

[45] Jul. 26, 1983

[54] FLOATING SUBSTRATE DYNAMIC RAM CELL WITH LOWER PUNCH-THROUGH MEANS

[76] Inventor: Eliyahou Harari, 2320 Friars La., Los Altos, Calif. 94022

[21] Appl. No.: 153,252

[22] Filed: May 27, 1980

[51] Int. Cl.³ .......................................... H01L 29/78
[52] U.S. Cl. ....................................... 357/23; 357/13; 357/42; 357/43; 307/291; 365/177; 365/180; 365/184
[58] Field of Search ........................ 357/23, 13, 34, 42, 357/43, 38; 307/291; 365/177, 180, 184

[56] References Cited

U.S. PATENT DOCUMENTS

| | | | |
|---|---|---|---|
| 3,264,493 | 8/1966 | Price | 357/43 |
| 3,401,319 | 9/1968 | Watkins | 357/43 |
| 3,404,295 | 10/1968 | Warner | 357/13 |
| 3,553,541 | 1/1971 | King | 357/43 |
| 3,624,468 | 11/1971 | Emmasingel et al. | 357/13 |
| 3,893,085 | 7/1975 | Hansen | 365/184 |
| 4,003,076 | 1/1977 | Polata et al. | 357/34 |
| 4,053,798 | 10/1977 | Koike et al. | 357/42 |
| 4,090,254 | 5/1978 | Ho et al. | 357/43 |
| 4,158,238 | 6/1979 | Erb | 357/23 |
| 4,231,055 | 10/1980 | Iizuka | 357/42 |
| 4,247,861 | 1/1981 | Hsu et al. | 357/23 |
| 4,254,427 | 3/1981 | Lohstroh | 357/13 |

FOREIGN PATENT DOCUMENTS

| | | | |
|---|---|---|---|
| 2539967 | 3/1977 | Fed. Rep. of Germany | 357/43 |
| 44-1656 | 1/1969 | Japan | 357/43 |
| 52-10087 | 1/1977 | Japan | 357/43 |
| 52-26181 | 2/1977 | Japan | 357/43 |
| 52-45885 | 4/1977 | Japan | 357/43 |
| 52-75135 | 6/1977 | Japan | 357/43 |
| 55-44750 | 3/1980 | Japan | 357/43 |
| 55-44751 | 3/1980 | Japan | 357/43 |
| 1436439 | 5/1976 | United Kingdom | 357/42 |
| 680051 | 8/1979 | U.S.S.R. | 357/23 |

OTHER PUBLICATIONS

F. Wanlass, "Novel Field Effect Device Provides Broadband Gain," Electronics, Nov. 1, 1963, pp. 30–33.
F. Gaensslen et al., "Hybrid IGFET-Bipolar Transistor," IBM Tech. Discl. Bull., vol. 12 #12, May 1970, pp. 2327, 2328.
D. Kemerer, "FET-Emitter Follower Cell," IBM Tech. Discl. Bull., vol. 14 #1, Jun. 1971, p. 208.
T. Chiu et al., "Floating Gate Field-Effect Transistor Memory", IBM Tech. Discl. Bull., vol. 16 #2, Jul. 1973, pp. 619, 620.
R. Carballo et al., "Self-Contained Bipolar-FET Device," IBM Tech. Discl. Bull., vol. 19 #11, Apr. 1977, pp. 4191, 4192.
I. Ho et al., "HS-HD Bipolar Random-Access Memory", IBM Tech. Discl. Bull., vol. 21 #1, Jun. 1978, pp. 195–197.

*Primary Examiner*—Joseph E. Clawson, Jr.
*Attorney, Agent, or Firm*—Alan H. MacPherson; Steven F. Caserza; Richard Franklin

[57] ABSTRACT

In accordance with this invention, a dynamic RAM cell comprises a substrate of one conductivity type in which is formed a first region of a second and opposite conductivity type and a first pocket of this second conductivity type. The first pocket has formed therein a second pocket of the same conductivity type as the substrate but of a higher doping concentration than the substrate. By forming a channel between the first region and the first pocket, the charge in this first pocket can be controlled to represent a selected bit of information. The magnitude of charge stored in this first pocket can then be determined by forming a channel across this first pocket to the second pocket from the substrate. The time rate of change of the potential in the second pocket then is representative of the stored charge of information in the first pocket due to the fact that the impedance of the channel formed across the first pocket is directly related to the amount of charge stored in the first pocket.

5 Claims, 11 Drawing Figures

FLOATING SUBSTRATE DYNAMIC RAM CELL WITH LOWER PUNCH-THROUGH MEANS

TECHNICAL FIELD

This invention relates to a dynamic random access memory (hereinafter called a "DRAM") and in particular to a DRAM using the potential of a floating P-well (or N-well) as the storage element.

BACKGROUND

High density dynamic random access memories are well known in the art. An article entitled "A Survey of High Density Dynamic RAM Cell Concepts" published in the IEEE Transactions on Electron Devices, Volume ed.-26, No. 6, June 1979, describes a variety of dynamic RAM cell concepts and compares these concepts to the industry's standard N-channel, MOS Dynamic RAM Cell. The prior art DRAMS basically store information in the form of the presence or absence of a charge packet stored on a single capacitor accessed by a single transistor. In very high density DRAM arrays, the geometrical area of the storage capacitor is very small, making detection of the presence or absence of the charge packet exceedingly difficult. For example, state of the art DRAM arrays utilize sense amplifiers which must be capable of sensing signals of less than 100 millivolts magnitude. This makes such arrays extremely susceptible to process variations as well as to spurious signals and external influences such as alpha particle radiation.

SUMMARY

The present invention provides a DRAM cell which provides a transistor amplification of the stored charge packet, yet can be implemented in no lesser a packing density than prior art cells.

In accordance with this invention, the well-known variation of threshold voltage of a standard MOS transistor with substrate voltage $V_{BB}$ is turned to advantage to produce a DRAM which has natural isolation and which lends itself to higher packing densities because it does not relay on the area of a capacitor for the storage of charge as do prior art DRAMs. Furthermore, the transistor of this invention retains its information for longer time than do surface DRAMs and therefore exhibits less frequent need for refresh. Each transistor in the DRAM structure of this invention produces a larger signal than do prior art DRAM transistors and provides a non-destructive readout and a faster access to each transistor. Furthermore, the structure of this invention provides almost complete immunity to alpha particle-induced soft errors of the type which have plaqued prior art dynamic RAMS.

In accordance with this invention, a DRAM cell comprises a substrate of one conductivity type in the top surface of which are formed a first region of a second and opposite conductivity type and a first pocket of this second conductivity type. The first pocket has formed therein a second pocket of the same conductivity type as the substrate, but of a higher doping concentration than the substrate. This second pocket comprises a bit line and the first pocket of opposite conductivity type in which the second pocket is formed comprises a storage region for charge. The first region of the same conductivity type as this storage region comprises a bit line for writing information into the storage cell. The substrate is selectively biased to provide the proper operating potential for the structure. Overlying the region between the first regin and the first pocket (both of opposite conductivity type) and a portion of the first pocket but insulated therefrom is a gate which comprises a word line.

This invention will be more fully understood in view of the following drawings taken together with the detailed description which follows.

DETAILED DESCRIPTION

Figure 6:
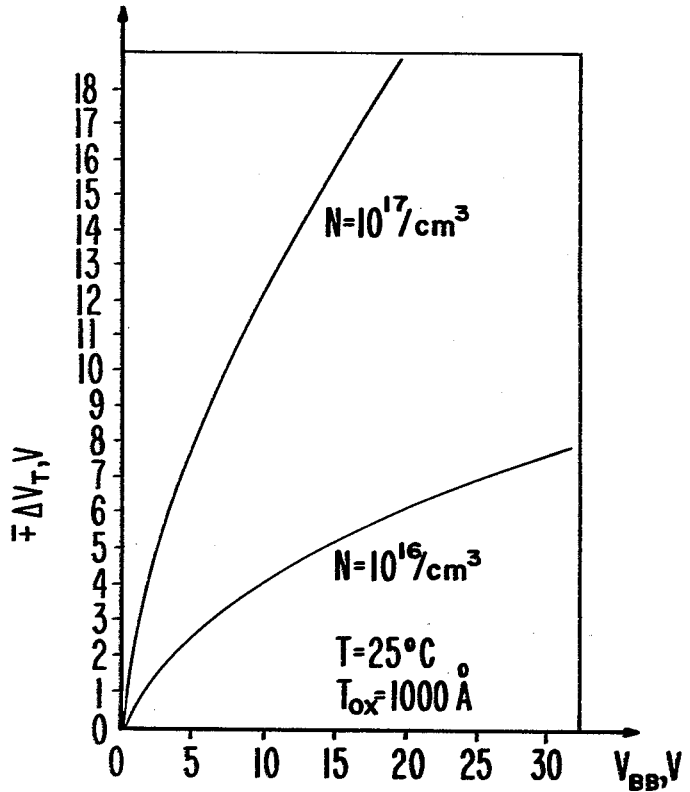
FIG. 6 shows the dependence of MOS device threshold voltage $V_T$ on the source-to-substrate voltage $V_{BB}$ of the device for various substrate doping concentrations.

Standard N-channel MOS devices have a common P-type substrate. It is well-known that the substrate voltage $V_{BB}$ influences the N-MOS transistor threshold voltage. As shown in the book entitled "MOS Field-Effect Transistors and Integrated Circuits" by Paul Richman, published in 1973 by John Wiley & Sons, Inc., Section 2.3, page 32, the threshold voltage of MOS transistors varies with the applied substrate-to-source bias. As disclosed there, the required threshold voltage changes both with dopant concentration and with the substrate-to-source voltage. This strong relationship is illustrated in FIG. 6. Thus, with an N-Channel MOS structure formed in a P-type substrate, the more negative $V_{BB}$, the higher the threshold voltage. This concept is used in the present invention for the storage of data in a dynamic RAM.

Figure 1A:
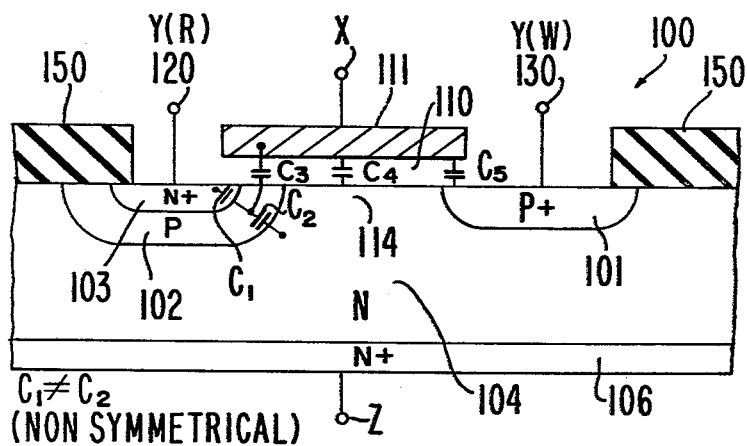
FIG. 1A shows in cross section the basic device structure of this invention for use in forming a semiconductor memory array.
Figure 7:
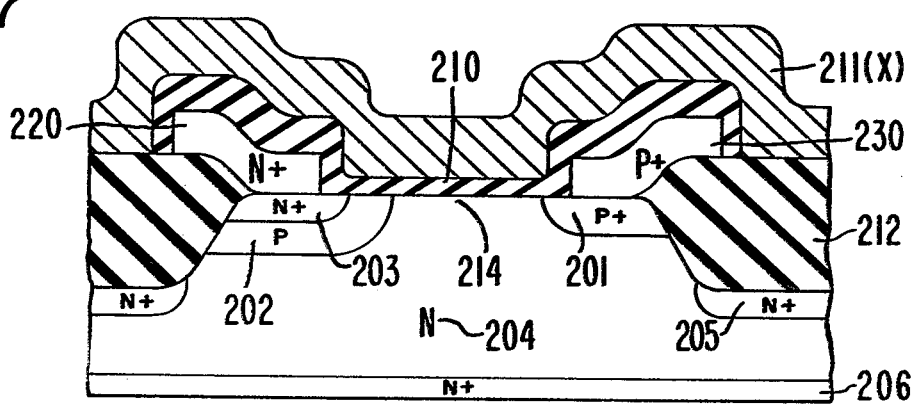
FIG. 7 shows in cross-section one version of the structure shown schematically in FIG. 2A.

The basic cell 100 of this invention is shown in cross section in FIG. 1A and again in FIG. 7. It should be understood that other devices identical to device 100 are formed in the same monolithic chip of silicon material to comprise together with peripheral circuitry a semiconductor memory and that these other devices are identical in cross section to the device shown. In the structure of FIG. 1A, an N-type semiconductor substrate 104 has formed on the bottom surface thereof an N-plus type region of semiconductor material 106 for use in making ohmic contact to the substrate 104. Formed in the top surface of substrate 104 are P-type regions 102 and 101. P-type region 102 is a localized pocket, typically but not necessarily formed by diffusion, which typically has an impurity concentration ranging from $1 \times 10^{15}$ cm$^{-3}$ to $1 \times 10^{17}$ cm$^{-3}$ while a P-type region 101, typically formed in a separate operation such as a diffusion, is of higher conductivity having an impurity concentration in the range of about $1 \times 10^{18}$ cm$^{-3}$ to $5 \times 10^{19}$ cm$^{-3}$. The impurity is preferably boron. Of course, other impurities and impurity concentrations for these two regions can be used as appropriate for the particular design goals of the device. Formed in P-type region 102 is N-plug region 103. N-plus region 103 is typically formed by diffusion, for example, using arsenic or phosphorous and has an impurity concentration in the range of from $1 \times 10^{19}$ cm$^{-3}$ to $1 \times 10^{20}$ cm$^{-3}$. Formed over the top surface of the structure is a field oxide layer 150 of a first selected thickness and a gate oxide layer 110 of a second, thinner selected thickness. Openings in the gate oxide 110 and the field oxide 150 allow the formation of electrical contacts 120 and 130 to N-plus type region 103 and P-plus type region 101, respectively. Electrical contacts 120 and 130 are electrically insulated from conductive gate 111 (formed from any conductive material but preferably polysilicon or aluminum) which forms the gate of the device and a word line in the array.

Figure 1B:
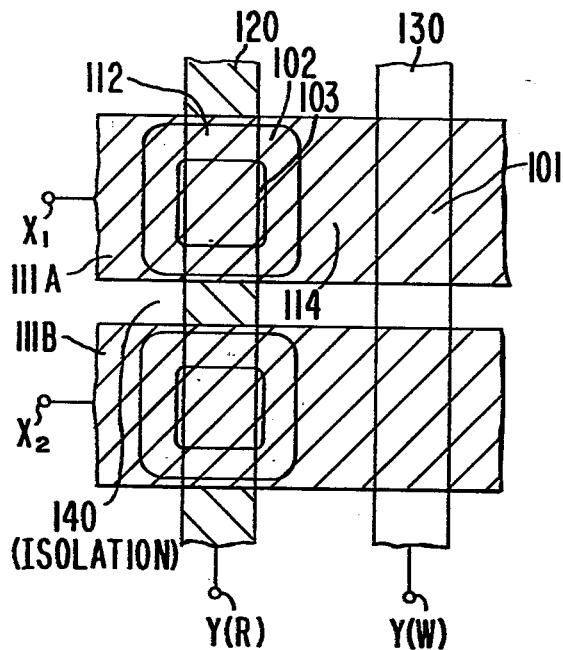
FIG. 1B shows in top view two cells of a semiconductor memory array utilizing the device shown in cross section in FIG. 1A.

FIG. 1B shows the structure of FIG. 1A in top view. As shown in FIG. 1B, the P-well region 102 intersects the top surface of semiconductor substrate 104 to form a substantially rectangular band (tub) surrounding the N-plus type region 103. Contact to the N-plus type region 103 is made through a strip of conductive material 120 which serves as the read line for the memory. Likewise, contact to the region 101 is made through conductive strip 130 which serves as the write line for the structure. Naturally, contact strips 120 and 130 are insulated from those portions of the underlying semiconductor material to which electrical contact is not to be made. The word lines 111A and 111B for two rows X$_1$ and X$_2$, respectively, overlie but are insulated from both conductive strip 120 and conductive strip 130. Between each cell in rows X$_1$ and X$_2$, for example, is formed isolation 140 (FIG. 1B) which typically is junction isolation, but, as will be seen shortly, can also be recessed oxide, otherwise known as an isoplanar-type isolation (see U.S. Pat. No. 3,648,125 for a description of the isoplanar process and structure made thereby). Thus, as is apparent from FIGS. 1A and 1B taken together, each bit has a single word line X (111A or 111B in FIG. 1B) which overlaps both a P-region 102 and an N-region 103. The P-region 102 completely surrounds and isolates the N-plus region 103 which is accessed via a contact opening in its insulation to contact line 120 (Y(R)), the "read" column in FIG. 1A. Preferably, contact line 120 is an N-plus doped polycrystalline silicon bit line (Y(R)) passing over thick field oxide in the regions between adjacent bits on the same Y column. No field isolation is required since the P-well 102 is self-isolated. Typically, P-well 102 is formed as in the well-known DMOS process by diffusion of boron through the same contact opening as used to form N plus type region 103. Thus, the process is inherently simple in that a single opening serves as the diffusion mask for two diffusions. Such a process is shown, for example, in a paper entitled "A 4096×1 (I$^3$L)* BiPolar Dynamic RAM" by Wendell B. Sander and James M. Early published in the Transactions of the ISSCC, 76/Friday, Feb. 20, 1976. This paper discloses the formation of a base region and an emitter region using a single diffusion in a bipolar process.

A region for contact by the second column line 130 (Y(W)), (the "write" column) is formed by diffusing a P-type impurity such as boron to provide a P-plus conductivity region 101. Of course, contact line 130 can be a P-plus doped polycrystalline write line passing over thick field oxide in the regions between adjacent bits in the same Y column and contacting pockets comprising regions 101.

The substrate 104 is shown as N-doped, but may be formed from an N-epitaxial layer or an N-plus doped substrate.

In operation, the structure of FIGS. 1A and 1B is programmed by varying the potentials on word line 111 and the P-plus column 130. To write a "0", P-well 102 is placed at zero volts while to write a "1", P-well 102 is placed at a potential of about minus three volts. The P+NP transistor regions 101, 104 and 102 are used to change region 102 to either zero volts or minus three volts. To write a "0" into the transistor, for example, the voltage on conductive strip 120 (Y(R)) is held at zero volts, the gate voltage on X gate 111A is lowered to minus five (−5) volts to form a conductive P-channel connecting P-well 102 to P-plus well 101 and the potential on conductive strip 130 is held at zero volts thereby insuring that the potential of P-well 102 goes to zero volts. Accordingly, the channel inversion threshold of the N+PN MOS transistor formed from N-plus type region 103, P-well 102 and N-substrate 104 becomes about 1.4 volts.

To write a "1" into the transistor, the above procedure is repeated except that the potential on conductive strip 130 is lowered to minus three (−3) volts. Accordingly, the potential in P-well 102 goes to minus three (−3) volts and the turn-on voltage threshold for the N+PN MOS transistor formed by regions 103, 102 and 104 becomes approximately +2.5 volts.

Once a bit information (either a "0" or a "1") is stored in P-well 102, the regions 103, 102 and 104 are operated as an N-channel transistor with P-well 102 serving as the P-substrate and N-plus region 103 and N-type region 104 serving as the source and drain, respectively.

Once the gate voltage is removed from gate 111 then the programming voltage is removed from conductive strip 130 and the P-well remains charged until thermally or optically losing its excess charge. This can take several milliseconds at which time a sense and refresh cycle is necessary as in other dynamic RAMS.

The reading out of the information stored in the cell is non-destructive and, unlike the read cycle in standard RAMs, is an active transistor read thereby providing a much higher signal level than the capacitor charge dumping of standard RAMS. Reading occurs by charging conductive strip 120 (Y(R)) which is electrically connected to one arm of a balanced sense amplifier (not shwown) of a well-known design, to some positive voltage (such as +2.5 volts), raising the word line 111 (X) to about plus 5 volts and monitoring the rate of change of voltage of conductive strip 120 (Y(R)). If the N+PN MOS transistor formed from regions 103, 102 and 104 is in the high threshold state (that is, if its potential is at about minus three (−3) volts) the voltage change of conductive strip 120 (Y(R)) will be much slower than if it is in the low threshold state (i.e. with zero volts on P-well 102). The rate of change of voltage is compared to a reference cell attached to the other arm of the sense amplifier, which therefore causes it to flip and latch in a "0" or "1" state. The reading is non-destructive because the surface channel formed across the P-type region 102 from N-plus type region 103 to N-region 104 does not discharge the excess charge in P-well 102 since the PN junction between P-well 102 and this surface channel is back biased. During this operation the substrate 104 is held at plus five (+5) volts by means of the application of this potential to contact 106. The positive bias on the control gate 111A (X$_1$) shuts off the MOS transistor formed from P-plus region 101, P-region 102 and N-substrate 104. Thus, the charge in P-well 102 is not allowed to discharge through a channel to P-plus well 101.

During the read and write operations, all unselected X word lines have their voltage X=0 volts. This potential keeps both the N-channel and P-channel MOS transistors formed from regions 103, 102 and 104, and from regions 102, 104 and 101, respectively, off.

One advantage of this structure is that the P-well 102 is naturally isolated since the substrate 104 is at a higher voltage than the P-well, thereby back biasing the PN junction between these two regions. Thus the structure lends itself to shrinkage because it does not relay on the area of a capacitor for charge storage but rather merely on the charge stored in the volume of P-well 102. Furthermore, because generation-recombination of charge in surface states is substantially lower in this cell, the charge is held in P-well 102 for a longer period of time than with most surface dynamic RAMS, thereby decreasing refresh cycle frequency. The output signal from the device is larger than with prior art DRAMs and the readout is non-destructive. Therefore, the device provides a potentially faster access during the read operation than the prior art structures. Finally, because of the quantity of charge placed in P-well 102 and because of reverse-biased voltage conditions during storage, the device provides a potentially better immunity to soft errors due to radiation effects than prior art DRAMS. Naturally, the above advantages are obtained partially as a result of a trade off in some areas. Thus, the process used to make this structure is potentially more complex because of the requirement for a P-plus diffusion to form P-region 101 and the P-well diffusion to form P-region 102. Moreover, to operate the structure, negative as well as positive gate and diffusion voltages are required. However, these voltages can be provided in a relatively easy manner using the typical minus five volt supply and CMOS peripheral circuitry. The CMOS circuitry is particularly useful with this process because the process uses CMOS type processing steps in conjunction with the formation of P-well 102 and N-plus region 103 therein. Finally, although the read step is non-destructive, writing is destructive for the bits in the unselected columns sharing a selected X line such as line 111A. Therefore, writing must be preceded by reading and latching the stored data on all bits of the selected row so that they can be written back into the cells during the subsequent write cycle. This, however, is no different from what is now required in the operation of standard dynamic RAMS.

Figure 2A:
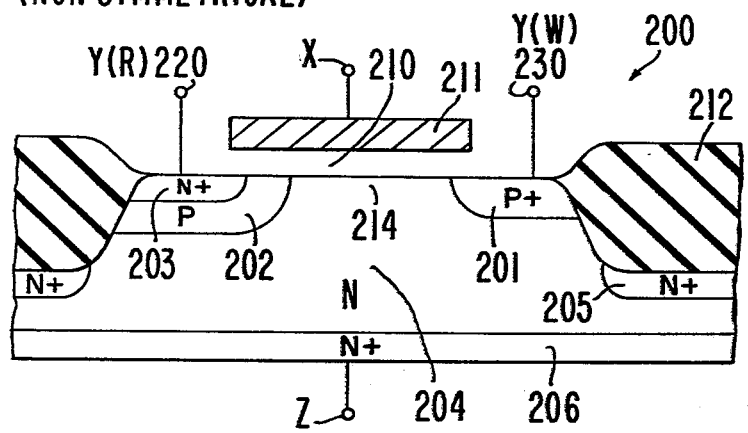
FIG. 2A shows the same device as in FIG. 1A but with recessed oxide isolation between adjacent devices for increasing the density of the array.

FIG. 2A shows a structure identical to that shown in FIG. 1A with the exception that the isolation is formed by recessed oxide (just as in the isoplanar MOS process depicted in, for example, U.S. Pat. No. 3,913,211). The operation of this structure is precisely the same as with the structure shown in FIG. 1A. The main difference is that the isolation occurs partly as a result of the reverse biased PN junction between P-well 202 and N-type substrate 204 and partly as a result of recessed oxide 212. Formed beneath recessed oxide 212 are N-plus channel stop regions 205 which serve, in a well-known manner, to prevent leakage paths from forming beneath the oxide. In addition, regions 205 also lower the substrate 204 resistance so that the read operation becomes more efficient.

Figure 2B:
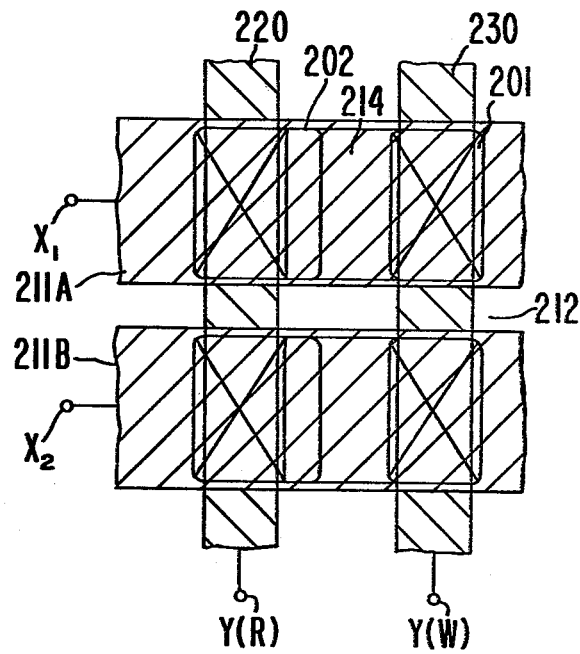
FIG. 2B shows in top view two memory cells formed in the array using the device shown in cross section in FIG. 2A.

A top view of the structures shown in FIG. 2A is shown in FIG. 2B. Note the relatively smaller cell sizes of the structure of FIG. 2B compared to the structure shown in FIG. 1B. This reduction in cell dimensions occurs as a result of the use of the isoplanar process for the formation of the device. In FIG. 2B, oxide surrounds the P-well 202 on three sides. The fourth side comprises the channel region 214 between P-well 202 and P-plus well 201. Conductive strips 220 and 230 are shown in comparable locations to the corresponding strips 120 and 130 in FIG. 1B and conductive strips 211A and 211B are likewise shown in comparable locations to strips 111A and 111B in FIG. 1B. Each of these elements serves the same function in the structure of FIG. 2B as its corresponding element does in FIG. 1B.

As is apparent from the drawings in FIGS. 1A and 2A, corresponding elements in the two structures are denoted with corresponding numbers. Thus, P-well 102 in FIG. 1A corresponds to P-well 202 in FIG. 2A and N-type substrate 104 in FIG. 1A corresponds to N-type substrate 204 in FIG. 2A.

Figure 3A:
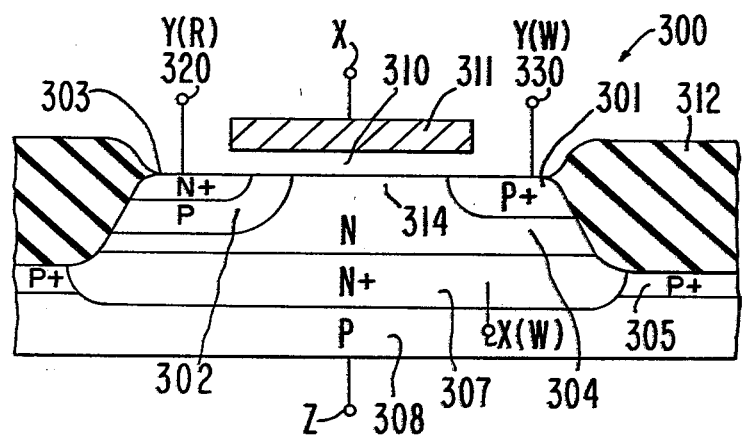
FIG. 3A shows the same device as in FIG. 2A with the addition of a buried isolation and interconnection layer and an expitaxial layer formed on top thereof in a manner analogous to the fabrication of a standard bipolar transistor.

An additional embodiment of this invention is shown in FIG. 3A. This embodiment is identical to that shown in FIG. 2A except that the structure is formed on a P-type substrate 308 and employs an N-plus type buried layer 307 which serves as the X(W) line and also serves, together with recessed oxide 312, to isolate each cell from adjacent cells. Thus, N-plus buried region 307 is formed in the top surface of P-type substrate 308 and substrate 308 then has formed on it an epitaxial layer 304 of N-type conductivity. The recessed oxide regions 312 are then formed through the epitaxial layer and contact the N-plus buried layer 307 in a manner well known in the semiconductor arts and as exemplified in U.S. Pat. No. 3,648,125, for example. P-type well 302, P-plus region 301 and N-plus region 303 are then formed in the semiconductor material 304 in a manner well known in the art. This remaining structure is fabricated in a manner similar to that disclosed in U.S. Pat. No. 3,873,989 issued Mar. 25, 1975 on an invention of Schinella et. al. entitled "Double Diffused Lateral Transistor Structure" but differs from this prior art structure by comprising an MOS structure rather than a bipolar structure and by employing gate 311.

While the prior art has disclosed a structure known as the BIMOS structure which has a cross section similar to that shown in FIG. 1A, the prior art structure basically comprises a P-channel MOS device made up of regions analogous to P-well 102, substrate 104 and P+ region 101 (FIG. 1A) and a bipolar NPN transistor made up of regions analogous to N+ region 103, P region 102 and N substrate 104. This prior art structure used a gate electrode corresponding in part to electrode 111 (but not extending over N+ region 103) to control the base current to the NPN transistor. The P-type channel formed between regions analogous to regions 102 and 101 provided a high impedance current path for controlling the base current to the NPN transistor. This transistor was biased as an emitter follower.

The structure of this invention to the contrary comprises a merged P-channel MOS and N-channel MOS structure using a common gate electrode wherein by applying a positive (negative) potential to the gate electrode one (the other) of the channels is turned on while the other (one) channel is turned off.

Figure 4A:
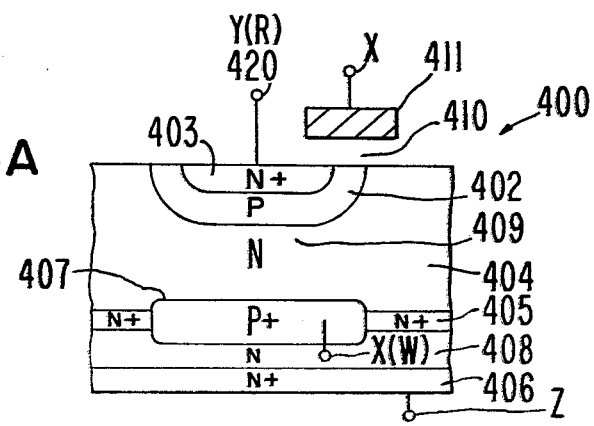
FIG. 4A shows a device with a floating substrate programmed by punchthrough from a buried diffusion which likewise uses in its fabrication an epitaxial layer and which can be fabricated using either junction isolation or recessed oxide isolation to enhance the packing density of the device.

The structures of FIGS. 1A, 2A and 3A can also be implemented in another embodiment which relies on punchthrough for charging the floating substrate corresponding to P-well 102 in FIG. 1A and P-well 202 in FIG. 2A. This embodiment uses a vertical structure with much smaller area per bit than in the previously described structure. Here the P-plus diffusion line corresponding to P-plus region 101 in FIG. 1A and P-plus region 201 in FIG. 2A becomes a buried region 407 formed within the semiconductor chip. Thus, as shown in FIG. 4A, N-type substrate 408 on which has been formed N-plus contact region 406 to be used for controlling the voltage applied to the substrate has formed thereon a P-plus region 407 by well-known means such as either ion-implantation or diffusion. The formation of a region such as region 407 is well-known in standard bipolar semiconductive processing and thus its formation will not be described in detail. Following the formation of P-plus region 407, an N-plus layer 405 is formed on the top surface of substrate 408. This is followed then by the growth of N-type epitaxial layer 404 on the substrate. During the growth of this epitaxial layer, P-plus impurity formed in region 407 in the top surface of the substrate 408 partially out-diffuses into epitaxial material 404. Following completion of the growth of epitaxial layer 404, a P-well 402 is diffused or otherwise formed in the top surface of epitaxial layer 404 and N-plus region 403 is then formed in P-type well 402. The device is then oxidized and a gate oxide is formed over the intersection of a selected portion of P-well 402 with the top surface of the structure. Field oxide (not shown but corresponding to field oxide 150 in FIG. 1A) is formed over the remainder of the device.

Figure 4B:
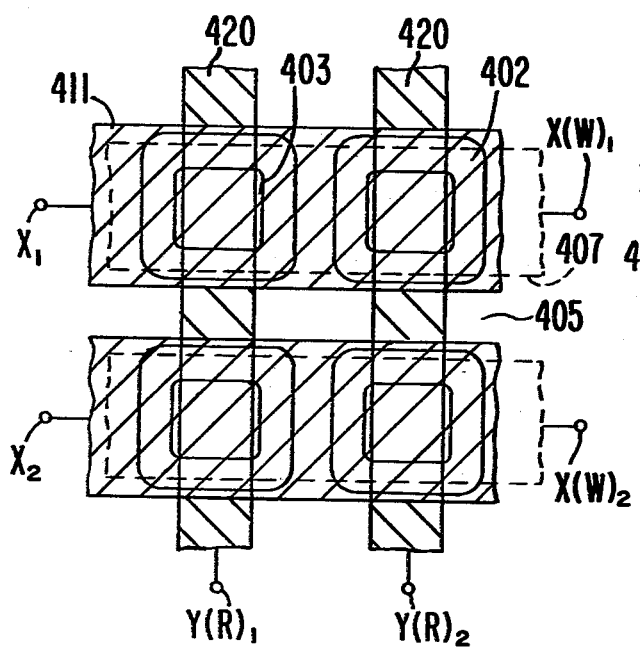
FIG. 4B shows a top view of four memory cells in an array using the device shown in FIG. 4A and illustrates the self-isolated nature of the charge storage area of this invention.

Note that the buried strip of P-plus diffusion 407 in cell 400 replaces the P-plus diffusion strip 130, 230 or 330 of cells 100 (FIG. 1A), 200 (FIG. 2A) or 300 (FIG. 3A), respectively. However, contrary to the cells of FIGS. 1A and 2A, the buried P-plus diffused region 407 is parallel to the X direction corresponding to conductive gate 111A or 111B rather than parallel to the Y direction as exemplified by conductive strip 130 (FIG. 1B). This is shown in the top view of FIG. 4B. To write in the cell shown in FIG. 4A, the P-well 402 must be negatively charged to zero volts or to minus three volts potential as in the case of the structure shown in FIG. 1A. The reading operation is also the same as with the structure of FIG. 1A. Thus Y(R) (which is connected to a sense amplifier) is precharged to a positive voltage and the time rate of change of voltage of Y(R) with gate 411 (X) turned on to about plus five (+5) volts is monitored. As with the structure of FIG. 1A, reading is non-destructive, but unlike the structure of FIG. 1A, writing is also non-destructive. Writing occurs only at the intersection of the selected column (Y(R)) and row (X(W)). Writing occurs through use of the well-known punchthrough mechanism (see, for example, U.S. Pat. No. 3,648,127 entitled "Reachthrough or Punchthrough Breakdown for Gate Protection in MOS Devices" on an invention of Lenzlinger for a brief explanation of the punchthrough phenomenon). Punchthrough occurs when the selected column Y(R) goes to plus five volts and the selected row X(W) goes to minus two volts or minus five volts, but not when either one of these two is at zero volts and the other of these two is five volts or less different in potential. The junction depths, impurity concentrations and other dimensions of the device shown in cross section in FIG. 4A and from top view in FIG. 4B are so arranged that approximately seven volts are required between N-plus region 403 (Y(R)), and P-plus region 407 (X(W)) to achieve punchthrough. Therefore, for any voltage greater than seven volts, the potential of the P-well 402 will simply track the difference over seven volts.

The correct sequence for writing information into P-well 402 is thus to first raise Y(R) to plus five volts, then drop X(W) to minus two or minus five volts, then bring Y(R) back to zero volts, and then bring X(W) back to zero volts. Although the substrate (406, 408, 405, 404 and 409) is at zero volts, the high resistivity N epitaxial layer 404 (typically doped between $1 \times 10^{14}$ cm$^{-3}$ and $1 \times 10^{16}$ cm$^{-3}$) means that the N-epitaxial region 409 in the punchthrough region is as good as floating. Thus, when the P-plus region 407 goes negative, the PN junction between P-well 402 and N-epitaxial layer 404 is forward biased thereby charging with electrons the P-well 402.

The structure of FIG. 4A is shown in top view in FIG. 4B. An isoplanar version of the structure shown in FIG. 4A is shown in top view in FIG. 4C to illustrate the saving in area and the increased packing density available by using isoplanar processing in the fabrication of this structure. As with the structure shown in top view in FIG. 2B, oxide surrounds P-well 402 on three sides while on the fourth side is substrate 404 to which N-plus region 403 is connected by a channel through P-well 402 when the proper potential is applied to gate electrode 411 during the read operation.

As a further means of reducing the size of the structure, one gate 411 can be used for two adjacent P-wells 402 and the particular P-well to be read out can be controlled merely by selecting the proper column line Y(R) attached to N-plus region 403 for activation. The top view of this structure is shown in FIG. 4C where the portion of P-well 402 in adjacent devices is formed in an asymmetric manner to allow one gate structure 411 to control two adjacent P-wells.

Figure 4C:
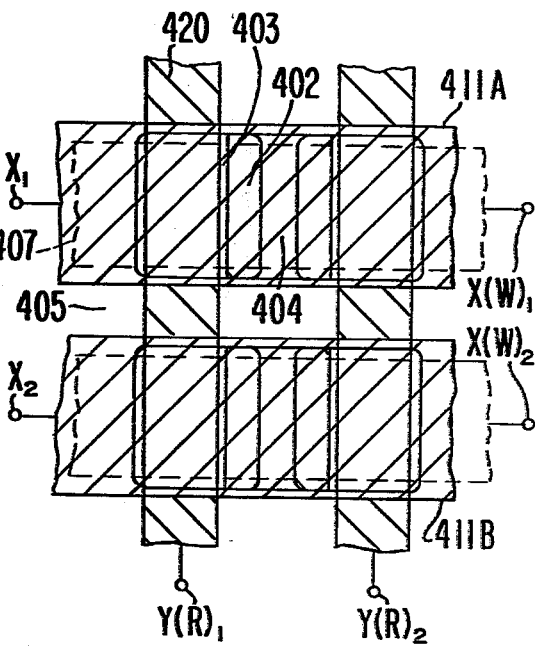
FIG. 4C shows the top view of four memory cells in a memory array of the structure shown in cross section in FIG. 4A using recessed oxide isolation.

An advantage of the structure shown in FIGS. 4A, 4B and 4C is that it becomes very compact and employs natural isolation of the P-well 402. Furthermore, non-destructive readout can be employed with a large read signal and the structure is relatively insensitive to soft errors such as generated by alpha particles. Finally, the device also has better storage time. Again, however, the processing is relatively more complicated involving the formation of high conductivity, buried, diffused strips and a high resistivity epitaxial layer and tight control in diffusion processes. This consideration alone may require the buried strips to be formed of arsenic or antimony diffusions thereby dictating reversing polarities of all other diffusion regions shown in FIG. 4A. The buried X(W) line corresponding to region 407 will have a higher parasitic capacitance and therefore a slower write than prior art devices, but this structure is perhaps of particular use in an isolated substrate technology such as the silicon-on-sapphire technology. Finally, the dimensions of the device must be carefully controlled to insure that one can write information into a given cell without disturbing the adjacent cells.

The embodiments described above store information by virtue of the presence or absence of charge on their floating substrates corresponding to P-wells 102, 202, 302 and 402. Each cell has its own isolated substrate as well as its own source diffusion isolated from each other such diffusions by the substrate diffusion or alternatively by a dielectric wall on three of its four sides. All the embodiments can be implemented in either N or P-channel technologies with the basic process closely resembling single or double level polysilicon CMOS processes. The process can yield CMOS type devices in the periphery which can then be used to advantage for reducing the chip power dissipation and handling positive and negative voltage pulses.

The read operation for all the embodiments is non-destructive with dynamic amplification at each storage site. It is possible to have multi-level storage at each bit at the expense of more complex sense amplifiers able to detect multi-current levels. Thus the floating substrate 102 (FIG. 1A) potential can be chosen to be one of four voltages, such as 0, −1.0 volt, −2.0 volt, and −3.0 volt to provide two bit storage per cell without increase in cell area. These voltage levels can all be generated internally on chip.

For binary storage, three voltage levels are required on chip. These levels can be zero, plus five volts and minus five volts or any two externally applied voltages such as zero and plus five volts which can be used internally to provide a third level in a manner well known in the semiconductor arts (such as by using passive signal-level-varying circuits of a well-known design, or by voltage multiplication on chip, or by charge pumping to form a negative voltage from a positive voltage).

Figure 5:
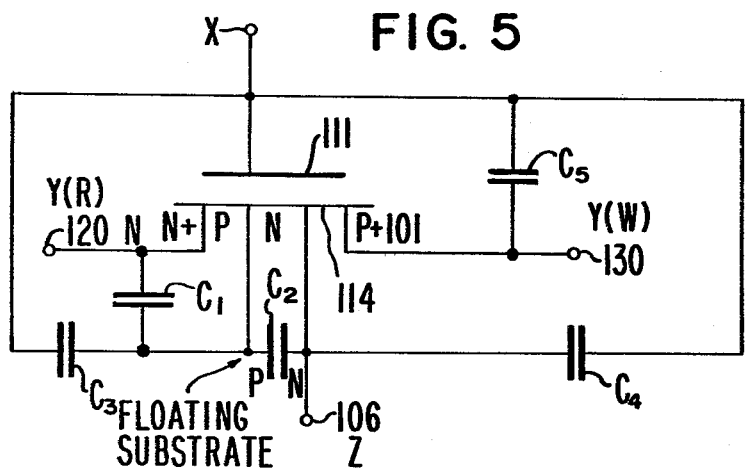
FIG. 5 shows the schematic diagram of the device shown in FIG. 1A with the relevant capacitances between the various elements of the structure shown in the cross section in FIG. 1A delineated.

Two modes of programming are possible either by MOS transistor action as exemplified by the structure shown in FIGS. 1A, 2A and 3A or by punchthrough as emplified by the structure of FIG. 4A. In addition, under certain write or read conditions, the floating substrate may be charged unintentionally through charge pumping where a capacitively coupled diode becomes momentarily forward biased. This condition must be minimized for all bias conditions experienced by each cell. One way of doing this is by assuring a proper ratio of coupling capacitances between the floating substrate and its source diffusion capacitance C1, its body (drain) junction capacitance C2 and its gate capacitance C3. These capacitances are shown schematically in FIG. 5. Ideally, the voltage on the substrate at Z 106 (FIG. 5) and Y(R) 120 should never vary from a given fixed voltage by more than a few hundred millivolts because of this effect and C3 should be made as small as possible so that when the voltage on the gate 111 goes from zero volts to plus five volts during read operation, the floating P-type substrate is not significantly coupled to forward bias it with respect to the surrounding N-plus regions. Another way to minimize this effect is to have the Y(R) and Z contacts biased so that the floating substrate cannot become forward biased under any operating conditions.

For example, for the cell 100 shown in FIG. 1A, Z can be kept at plus five volts with Y(R) kept at plus three volts during standby, going up to approximately 3.2 volts during read when X goes to plus five volts.

The choice of ratios for $C_1$, $C_2$, and $C_3$ determines not only the sensivity of the cell to spurious signals but also its ability to store excess charge, as well as memory array access times. A higher storage capacity is important because of the reduced need for refreshing, and because it increases the margin against potential alpha particle upset and similar soft errors. However, unlike prior art dynamic RAM cells, the size of the excess charge packet on the floating substrate can be made very small since it is not this charge that is detected during read, but rather an amplified signal whose magnitude is determined by the threshold of the accessed MOS transistor (made up, for example, of regions 103, 102 and 104 in the structure of FIG. 1A).

The choice of doping concentrations and oxide thicknesses determine not only the relative values of $C_1$, $C_2$ and $C_3$, but also the effectiveness of the body effect (i.e. the relationship between the potential on the floating substrate relative to the source and the threshold voltage of the MOS transistor).

To a first order approximation, the potential $V_F$ on the floating substrate can be described by the following equation $$V_F = (C_1 V_{Y(R)} + C_2 V_Z + C_3 V_X + Q_F)/(C_1 + C_2 + C_3)$$

where $Q_F$ is the excess charge on the floating substrate (zero for the low threshold state "0", and negative for the higher threshold state "1").

For a typical device the magnitude of $Q_F$ required to give a $\Delta V_F$ of three volts is:

$$Q_F = \Delta V_F(C_1 + C_2 + C_3) = 3 \times 10^{-14} \text{ coulombs} \approx 10^5 \text{ electrons.}$$

It is clear from the above discussion that the choice of read voltages depends on the choice of $C_1$, $C_2$, and $C_3$ with several different possibilities dictated by design and process considerations. The one single constraint is that no read condition should permit the floating substrate to become excessively forward biased, although forward biasing up to about one volt is permissible.

In the manufacture of the cell of FIG. 2A, for example, each bit or cell is formed in an N-minus substrate 204 on which has been formed thick isoplanar field isolation oxide 212, by forming a window 103 in a diffusion masking oxide and diffusing first a deep P-region 202 (the floating substrate in the to-be-formed N+PN P-plus structure made up of regions 203, 202, 204, and 201 respectively) then an N-plus source region 203 is driven less deeply into the structure than deep P-region 202. Region 202 is contacted by an N-plus doped line 220 comprising Y(R) and region 201 is contacted by a P-plus doped line 230 comprising Y(W). Preferably these lines are formed of polycrystalline silicon. The defined lines 220 and 230 are also used as a mask to etch away the diffusion masking oxide in exposed regions where channel regions 214 and 202 will be formed. A gate oxide 210 is grown which is also used to form isolation between lines 220, 230 and the second level interconnection 211(X) which runs perpendicular to lines 220 and 230 (see FIG. 7). The second level interconnect 211(X) forms the X line and can be either polycrystalline silicon or a metal or a metal silicide interconnect structure. Contacts are made in the periphery of the chip to the N-substrate (Z) and to the Y(R), Y(W) and X lines.

In cell 200 shown in FIG. 2A and in top view in FIG. 2B, the isolation is formed by partial oxidation of the silicon surface in a manner such as taught in U.S. Pat. No. 3,648,125 disclosing the isoplanar process thereby to form vertical oxide walls which restrict the side-way diffusion of the P-regions 202 in three out of four directions and thereby allow adjacent P-regions to be brought closer together than in the structure of FIG. 1A. Other than this isolation, the basic device structure and process for the formation of cell 200 is similar to that used in the formation of cell 100.

Table I illustrates the bias voltage ranges for the various operating modes of the dynamic RAM cells 100, 200, 300 and 400 disclosed in FIGS. 1A, 2A, 3A and 4A, respectively. The subscripts "sel" and "unsel" on the column headings denote either a selected one or an unselected word line, write line or read line. Thus the notation "$X_{sel}$ (V)" refers to the selected X word line, while the notation "$X_{unsel}$ (V)" refers to the unselected X word lines. Similar meanings are attached to the correspondings subscripts on the other headings in the Table.

As pointed out in the Table, all sense amplifiers are activated to sense all the bits along an accessed row X prior to a write operation because writing into a given cell would destroy all information in the other cells along the same X line. Accordingly, the write operation includes two steps; (a) a read operation to read out and latch in a sense amplifier the information in the cells along the X word line; and (b) a write operation to place the data into the selected cell and to replace the previously read out data back into the other cells. Table I illustrates the voltage levels typically contemplated for application to the various X and Y lines during these operations. Of interest, cell 400 is uniquely addressed for writing-in information by punchthrough at each cell. Therefore, cell 400 can be read out a row at a time, if desired, but written into a bit at a time without destroying the information in the other cells in the same row as the cell in which information is being written.

The voltages shown in Table I are approximate only and are intended to be relative not absolute. On-chip actual voltages may very well differ from those given in Table I.

While the above invention has been described in conjunction with a substrate and diffused regions of selected conductivity types, the conductivity types can, of course, be reversed from those shown while still staying within the scope of the invention. In this situation, the read and write voltages would also be reversed in polarity. Where regions are described as formed by diffusion, they often can be formed using ion implantation, if desired. Furthermore, those skilled in the semiconductor arts will recognize that other embodiments are obvious in view of the above disclosure.

TABLE I

| Operation | Bias Voltage Ranges for Various Operating Modes of DRAM | | | | | | |
|---|---|---|---|---|---|---|---|
|  | $X_{sel}$(V) | $X_{unsel}$(V) | $Y(W)_{sel}$ | $Y(W)_{unsel}$ | $Y(R)_{sel}$ | $Y(R)_{unsel}$ | Z(V) |
| Cells 100, 200, 300: | | | | | | | |
| Read: | 5 | 0 | 0 | 0 | 0 to 3V at S/A node | 0 to 3V at S/A node | 5V |
| Write 1 (High $V_T$) | | | | | | | |
| (a) Read: | 5 | 0 | 0 | 0 | 0 to 3V | 0 to 3V | 5 |
| (b) Write 1: | −5 | 0 | −5 or −1.0, −2.0, −3.0V etc. for multi-level write | 0 or −5V depending on data from (a) | 0 to 3V | 0 to 3V | 5 |
| Write 0 (Low $V_T$) | | | | | | | |
| (a) Read: | 5 | 0 | 0 | 0 | 0 to 3V | 0 to 3V | 5 |
| (b) Write: | −5 | 0 | 0 | 0 or −5V depending on data from (a) | 0 to 3V | 0 to 3V | 5 |
| Standby: | 0 | 0 | 0 | 0 | 0 to 3V | 0 to 3V | 5 |
| Cell 400: | | | | | | | |
| Read: | 5 | 0 | 0 | 0 | 0 to 3V at S/A node | 0 to 3V at S/A node | 5 |
| Write 1 (High $V_T$): | 0 | 0 | −5 | 0 | 5 | 0 | 5 |
| Write 0 (Low $V_T$): | 0 | 0 | −2.5 | 0 | 5 | 0 | 5 |

Note: All sense amps are activated to sense all bits along an accessed row X
Notes:
(1) Cell 400 is uniquely addressed for writing by punchthrough (cross-point cell). Therefore, it can be read a row at a time but written only a bit at a time.
(2) Voltages shown are only approximate, and only relative to each other. On chip actual voltages may be different.

What is claimed is:
1. A semiconductor memory array comprising a plurality of cells and selected peripheral circuitry including sense amplifiers, formed in a semiconductor substrate of a first conductivity type, wherein each cell comprises:
   a first charge storage means comprising a first region of a second conductivity type formed in said semiconductor substrate for the storage of charge representative of information;
   a second region of said first conductivity type formed in said first region;
   a third region of said second conductivity type formed in said substrate underneath and spaced from said first region;
   means for forming a punch-through conductive path to said first region from said third region to control the charge stored in said first region in response to a first selected set of potentials applied to said substrate, said third region and said second region;

insulated gate means for forming a conductive channel from said second region to said substrate through said first region in response to a second selected set of potentials applied to said substrate, said second region and said means for forming a conductive channel and means for measuring the time rate of change of potential in said second region in response to said second set of potentials to indicate the information stored in said first region.

2. Structure as in claim 1 including means for applying a first selected potential to said substrate;

means for applying a second selected potential to said third region;

means for applying a third selected potential to said second region;

means for applying a fourth selected potential to said means for forming, thereby to change the information stored in said first region.

3. Structure as in claim 1 wherein said means for forming a conductive channel comprises:

insulation formed on the surface of said substrate, and gate electrode means formed over said insulation thereby to control the formation of a conductive channel across said first region from said second region to said substrate thereby to enable the measurement of the state of the charge stored in said first region by measuring the time rate of change of the voltage in said second region upon the application of a voltage to said gate electrode sufficient to form a channel across said first region, and wherein said means for forming a conductive path comprises means for controlling the formation of a conductive path between said first region and said third region thereby to place a selected charge in said first region representative of the voltage of said third region so as to store selected information in said first region.

4. Structure as in claim 1 wherein said selected charge represents a selected one of several logic levels.

5. Structure as in claim 4 wherein said selected charge represents a selected one of two logic levels.

* * * * *